United States Patent
Borodovsky et al.

[11] Patent Number: 6,021,009
[45] Date of Patent: Feb. 1, 2000

[54] METHOD AND APPARATUS TO IMPROVE ACROSS FIELD DIMENSIONAL CONTROL IN A MICROLITHOGRAPHY TOOL

[75] Inventors: Yan Borodovsky; Patrick M. Troccolo, both of Portland, Oreg.

[73] Assignee: Intel Corporation, Santa Clara, Calif.

[21] Appl. No.: 09/107,970

[22] Filed: Jun. 30, 1998

[51] Int. Cl.[7] .................................................. G02B 5/22
[52] U.S. Cl. .............................. 359/888; 355/67; 355/71
[58] Field of Search .................................. 359/885, 888; 355/67, 71

[56] References Cited

U.S. PATENT DOCUMENTS

| | | | |
|---|---|---|---|
| 3,922,085 | 11/1975 | Sheets | 359/888 |
| 4,157,215 | 6/1979 | Hanak | 359/888 |
| 5,216,257 | 6/1993 | Brueck et al. . | |
| 5,343,292 | 8/1994 | Brueck et al. . | |
| 5,415,835 | 5/1995 | Brueck et al. . | |
| 5,426,498 | 6/1995 | Brueck et al. . | |
| 5,636,002 | 6/1997 | Garofalo | 355/71 |
| 5,674,652 | 10/1997 | Bishop et al. . | |
| 5,705,321 | 1/1998 | Brueck et al. . | |

*Primary Examiner*—Cassandra Spyrou
*Assistant Examiner*—Darren E. Schuberg
*Attorney, Agent, or Firm*—Blakely, Sokoloff, Taylor & Zafman LLP

[57] ABSTRACT

A technique for improving across field dimensional control in a microlithography tool. In a lithography imaging process in which a pattern on a mask is projected to form latent images in a photosensitive medium, the critical dimension distribution across the imaging field varies due to scattering and other factors. An optical compensator having gradient neutral density filter properties is used to reduce the intensity of light at those locations corresponding to regions of an imaging field having higher exposure dose. By reducing the intensity of light at the higher dose regions, the overall dose profile is made more uniform, which reduces linewidth variations when devices are fabricated on an semiconductor wafer.

23 Claims, 8 Drawing Sheets

METHOD AND APPARATUS TO IMPROVE ACROSS FIELD DIMENSIONAL CONTROL IN A MICROLITHOGRAPHY TOOL

BACKGROUND OF THE INVENTION

1. Field of the Invention

The present invention relates to the field of optical lithography and, more particularly, to the exposure of photosensitive material to light in order to pattern devices on a semiconductor wafer.

2. Background of the Related Art

The use of optical lithography to pattern devices that are fabricated in a semiconductor wafer (such as a silicon wafer) is well known and has been in practice for many years. Generally, a mask is used in which light absorbing elements present in the mask define a positive or a negative pattern in a photosensitive media such as photoresist. One common practice is to position light absorbing chrome on a transparent mask material, such as glass (or quartz). The light not absorbed by the chrome is projected through the mask and projection optics and exposes a photosensitive material (such as a photoresist) to form a latent image therein. Depending on the positive or negative nature of the photoresist employed, one area (the exposed or the unexposed area) is developed and removed. The areas of photoresist that were removed exposes the underlying substrate areas which are then processed by various techniques, including etching and ion implantation, which in conjunction with deposition techniques form device features, such as gates, interconnects, etc. The photoresist remaining on the surface functions as a mask when the underlying layer is processed.

FIG. 1, for example, illustrates a typical conventional diffraction limited microlithography technique, in which a mask (reticle) 10 is used to project a latent image onto a photosensitive target 11. Generally, light from a light source 12 is directed toward the target 11 to expose some form of photosensitive medium. In integrated circuit fabrication, the light source 12 is typically a non-coherent point source, although coherent light (such as a laser) can be used. The target is usually a photoresistive material (photoresist) deposited atop a semiconductor wafer.

When light passes through the mask 10, a pattern present in the mask 10 is projected and a latent image formed in the target 11. An optical element (such as a lens) or system 13a is used to focus and often reduce the image of mask 10 onto the target 11. Conventional microlithography tools are known as diffraction limited tools, since the imaging performance of the projection system is limited by the number of diffracted orders collected by projection system's Numerical Aperture while forming the image of smallest pattern on Mask 10 it is employed to resolve. As shown in FIG. 1, when illumination light 15 reaches the mask 10, it is diffracted by the mask features 17. For the smallest resolvable feature pitch present on the mask only the diffracted +1 and −1 orders, as well as the zero order, will be allowed to propagate through the projection system to form the image of the mask on the wafer 11 as shown in FIG. 1. As an illustrated example shown in FIG. 1, all three orders will interfere at the wafer plane at the point 16 on the wafer 11 to form the image of the corresponding point of the mask 10. It is appreciated that the structure and operation of conventional lithography tools for patterning semiconductor wafers is known in the art.

A typical mask 10 is fabricated from a transparent material (such as glass or quartz), sometimes referred to as a mask substrate. The mask 10 has light absorbing elements (light absorbers) 17 disposed on it to absorb light. The pattern of the light absorbers on the transparent substrate provides the transparent and opaque and patterns that are projected to expose the photosensitive medium present. That is, the mask pattern is projected to form a latent image in a photoresist 18. Since the feature dimensions are dependent on the image resolution of the optical system 13a and the photoresist 18, the feature dimension on an integrated circuit device is thus dependent on the smallest discernible dimension (referred to as the critical dimension, or CD) of the pattern formed in the photoresist 18.

Uniformity of integrated circuit (IC) features' critical dimensions is necessary to achieve highest possible IC performance. One factor that affects critical dimension's uniformity on the wafer 11 is scattered light that reach wafer 11, in addition to light diffracted by features 17 of the mask 10 that propagated through the optical system 13a, as shown for 0, +1 and −1 diffracted orders directions. Scattering is a well known physical phenomena that degrades the image being formed at the target. Essentially, any light that does not propagate along the line defined by physical diffraction direction is regarded as scattered light. Scattering has also been referred to as optical noise or flare. Although scattering is undesirable, it is appreciated that some amount of scattering will always be present with the diffraction limited conventional microlithography technique shown in FIG. 1. There are many causes of scattering in the lithography tool, some due to the process and others due to the tool itself. Some sources of scattering are still not well understood.

However, what is known is that the CD for a photosensitive medium may vary across its area, when formed through a microlithography process. Whether this variation in the CD is due to light scattering alone or combined with other factors, the variations are undesirable. Since the size of the resist features (such as gate or trench openings of an integrated circuit device) will depend on the combined dose produced by diffracted and scattered light in the exposed photoresist, the extent of the exposure difference on the photoresist pattern across the field of the image plane can result in feature size variations for the integrated circuit. Such variations in the feature (component and wiring) differences are undesirable, since performance of the integrated circuit may be impacted. For example, sizeable difference in the width of wiring lines can result in signal current variations.

Accordingly, it is appreciated that a more uniform CD distribution and uniformity of photoresist exposure can provide for a more uniform feature fabrication on the integrated circuit, so that overall integrated circuit performance is improved, or at least not degraded as device dimensions surpass below 0.35 micron technology.

SUMMARY OF THE INVENTION

The present invention describes a technique to improve across field dimensional control in a microlithography tool. In a lithography imaging process in which a pattern on a mask is projected to form latent images in a photosensitive medium, the critical dimensions across the imaging field varies due to a number of factors, including optical scattering. The variations in the critical dimension is attributable to the variation in the light exposure profile across the imaging field. The present invention provides for an optical compensation technique to adjust the higher exposure dose resulting from unfavorable combination of light diffracted by mask features and scattered light in a given area, so that a more uniform dose distribution across the exposure area is obtained. A more uniform dose distribution enhances the uniformity of the patterned features' critical dimensions across the imaging field.

The optical compensator of the present invention is implemented using light absorbers disposed to absorb light at those locations corresponding to regions of the pattern having higher exposure dose along the imaging field. By reducing the intensity of light at the higher dose regions, the overall dose profile is made more uniform, resulting in a more uniform critical dimension distribution. The improved uniformity allows for less variations in patterned feature's linewidth when devices are fabricated on an semiconductor wafer.

The optical compensator of the present invention can be implemented in a variety of ways. In one technique, a filter element having the light absorbers thereon is inserted between a patterning mask and its light source in a lithography tool. In another technique, the absorbers are placed on the back of the patterning mask.

DETAILED DESCRIPTION OF THE INVENTION

A technique for providing across field dimensional control in a microlithography tool is described. In the following description, numerous specific details are set forth, such as specific masks, structures, tools, processes, etc., in order to provide a thorough understanding of the present invention. However, it will be appreciated by one skilled in the art that the present invention may be practiced without these specific details. In other instances, well known techniques and structures have not been described in detail in order not to obscure the present invention.

As noted in the Background section above, microlithography tools impose some scattering when patterning photo-resistive materials. As integrated circuit device linewidth dimension approaches 0.35 micron and exceeds below it, the deleterious effects of scattering are more pronounced. This scattering is further compounded in a scanner type of microlithography tool.

Figure 1:
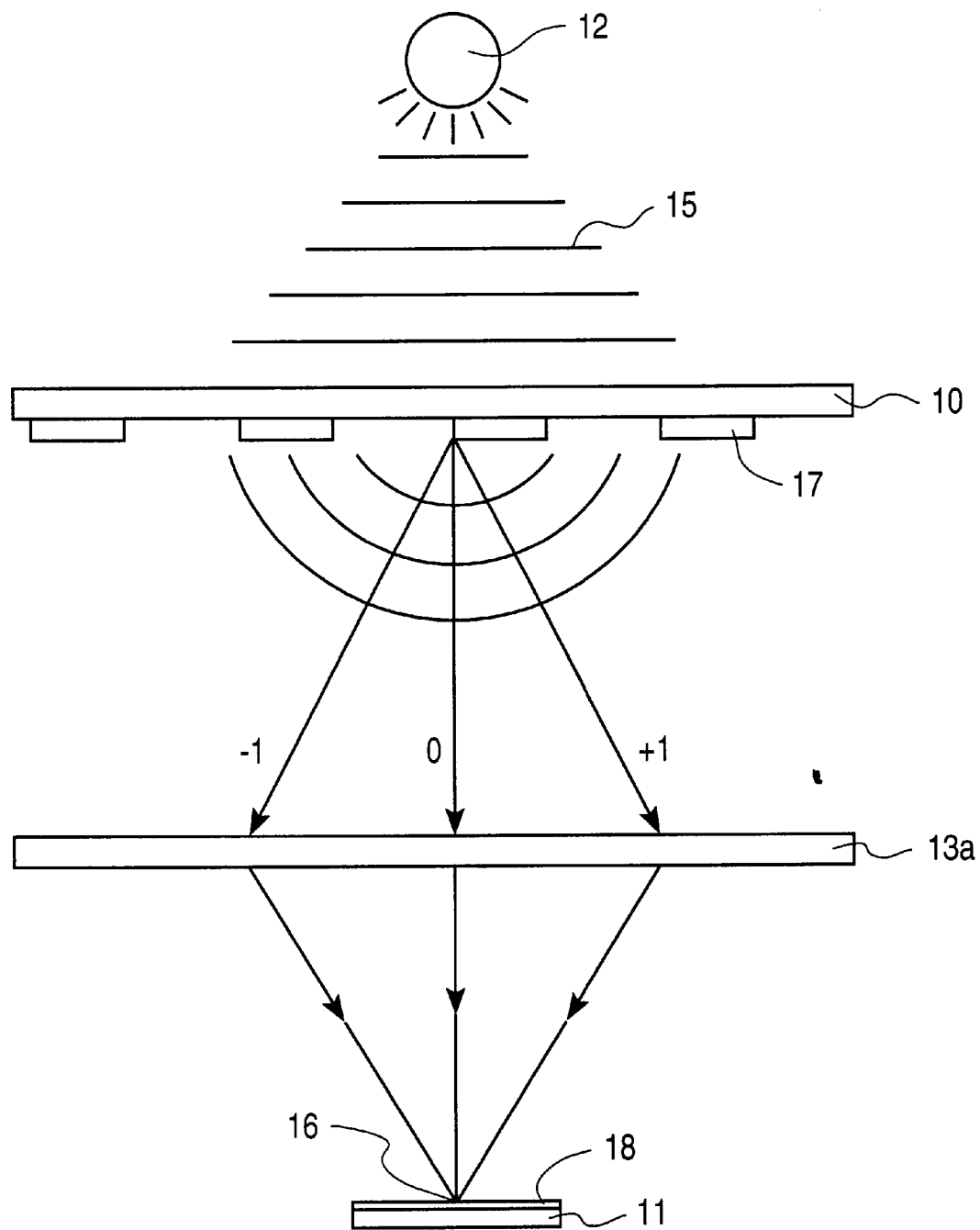
FIG. 1 is a cross-sectional diagram of a portion of a prior art microlithography tool in which light is projected through a mask to pattern an image onto a target.
Figure 2:
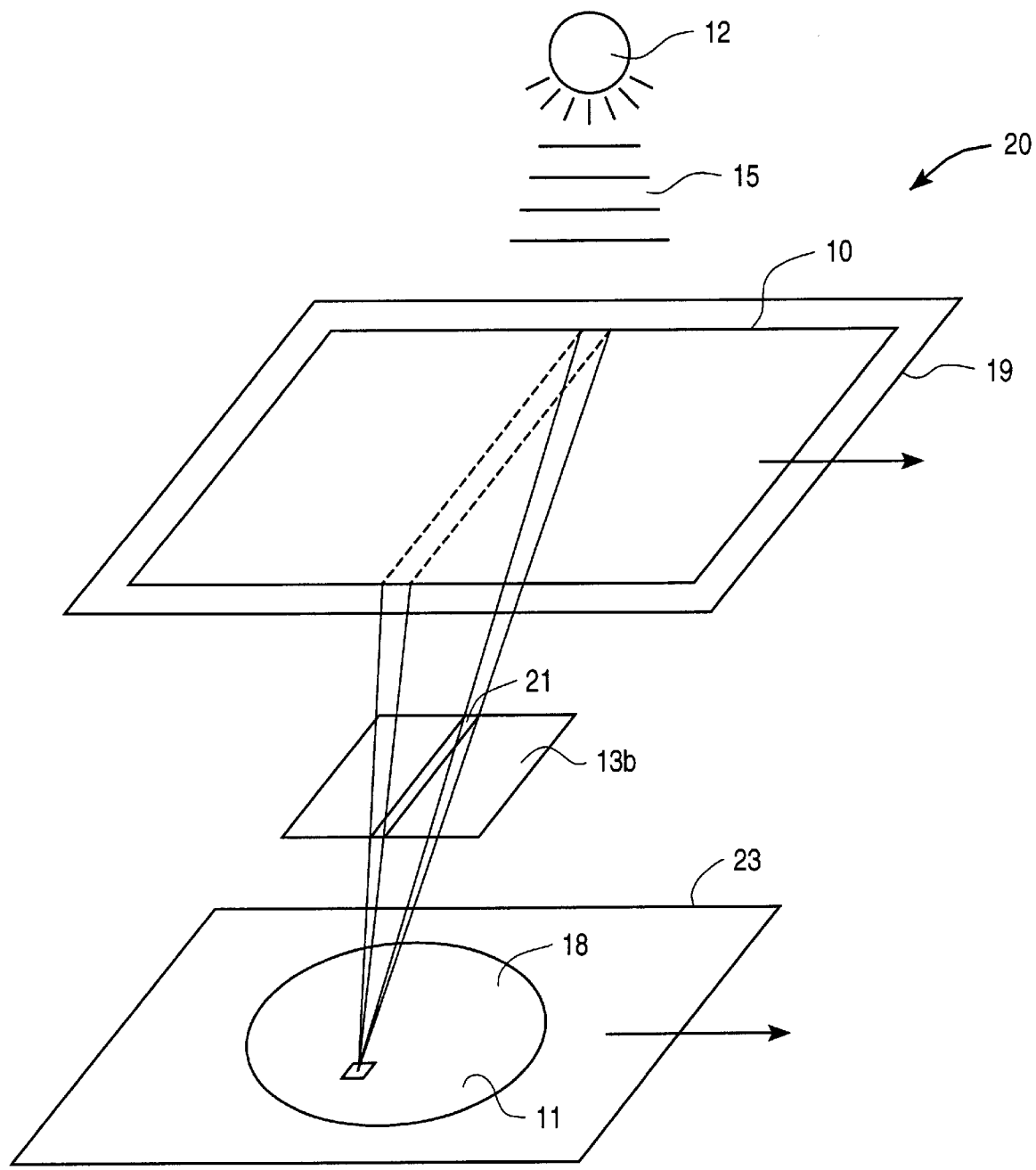
FIG. 2 is a pictorial view of a portion of a prior art scanning lithography tool, in which the mask and target are moved over an aperture to scan a pattern onto the target.

Referring to FIG. 2, an example of a prior art scanner tool 20 utilized for microlithography to form latent images in a photosensitive medium (such as a photoresist) is shown. Unlike the stepper (which is stationary when the image is being projected), a scanner mask stage 19 holding the mask 10 moves to project the mask pattern and to form a latent image onto the photosensitive medium, such as photoresist 18, formed on semiconductor wafer 11. The wafer 11 is mounted to a wafer stage 23 that moves synchronously with the mask stage 19. With the scanner 20, the mask 10 and the wafer 11 move in unison relative to a stationary projection optics, depicted as optical (lens) element or system 13b. The optical element 13b has an aperture (or slot opening) 21 that defines the portion of element employed to image the features of mask 10 as both the mask 10 and the wafer 11 move across the slot 21. Mask 10 has protective opaque area 17 (shown in FIG. 1) around the area that contains features which images need to be reproduced in the photosensitive area of the target wafer 11. Due to the presence of area 17 and scanning motion the combined light dose in the area corresponding to the width of the slot 21 at the beginning and at the end of the scan will be different (smaller) than at any other portion of the scanned field.

Figure 3A:
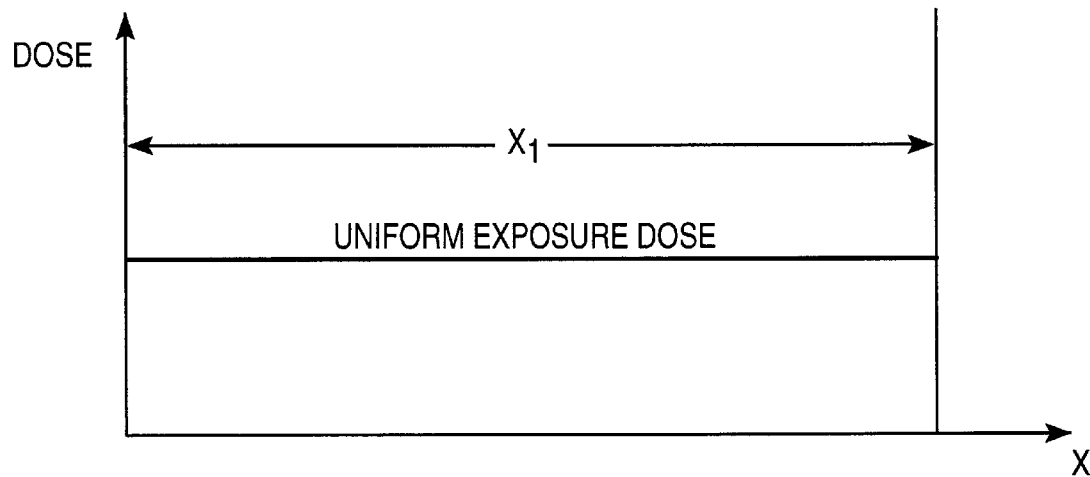
FIG. 3A is a graphical illustration showing a level of light exposure dose over scanning direction in the absence of scattering effects, in which the dose level stays constant along the entire scanned field length.
Figure 3B:
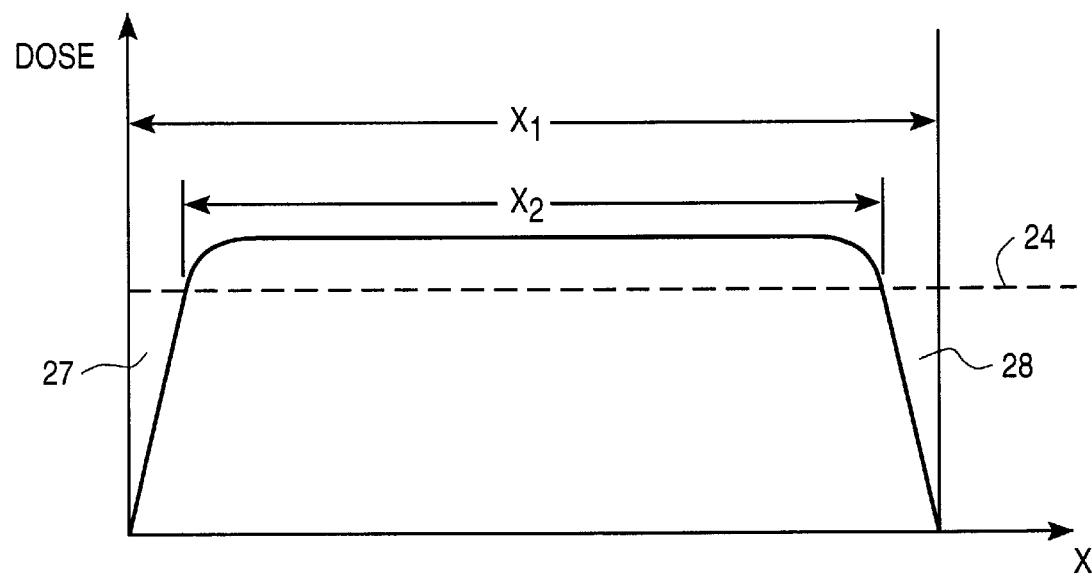
FIG. 3B is a graphical illustration showing a level of light exposure dose over the scanned field length in the scanning direction in the presence of scattering effects, in which the dose level is not uniform due to peculiarities of combining diffracted and scattered light in scanning systems.

FIG. 3B shows an impact of the scattering as the scanner of FIG. 2 scans to expose the target 11. It is appreciated that the ideal or desired dose distribution across the exposure area is illustrated in FIG. 3A. In the ideal situation, the level of light exposure dose over the scanning direction is uniform (constant). However, this desirable condition is generally not achieved with current microlithography practices. A more typical exposure dose is that exemplified in FIG. 3B. It is to be noted that the effects are more pronounced as the CD becomes smaller, in the range of 0.35 microns and under.

The graph of FIG. 3B shows light exposure dose distribution along the entire scanned field length in the scanning direction. Dose is the total amount of light exposure (light intensity over time) received by the target 11. Distance $X_1$ denotes the complete scan length in the scanning direction.

For a predominantly clear field reticle (a mask having only 20%–30% light absorbing chrome), the edge effects are quite pronounced. The start and end edges receive considerably less exposure than the middle portion of the feature when scanned. This same effect is present in the direction orthogonal to the scan direction but its intrusion into the field is defined by long range scatter distribution rather than by slot width as is the case for the scanning direction. The same effects are present in stepper tools, but the scattering is more pronounced in the scanner tool, due to the significant width of the slot 21 as compared to long range scatter intensity over the same length. As the mask is scanned to project the clear field image onto the target, the exposure dose is non-uniform at the target due to the above noted effect. It is appreciated that the ideal exposure condition for a feature is for the exposure to have uniform dose at the target, as shown by a dotted-line 24 in FIG. 3B.

The non-uniform exposure of the photoresist can have dire consequences for the uniformity of CD values, especially for feature sizes close to resolution limit of the projection optics. In the graph of FIG. 3B, the central region (noted as distance $X_2$ receives adequate dose to form the latent image in the photoresist. The two peripheral regions will receive less exposure. As a result, linewidth of the features contained in regions 27 and 28 (where dose distribution is non uniform) will be different from the features' linewidth residing in the region noted by $X_2$, as well as from each other continuously through the regions 27, 28, which will result in diminished performance of the integrated circuit or even its failure.

Figure 4A:
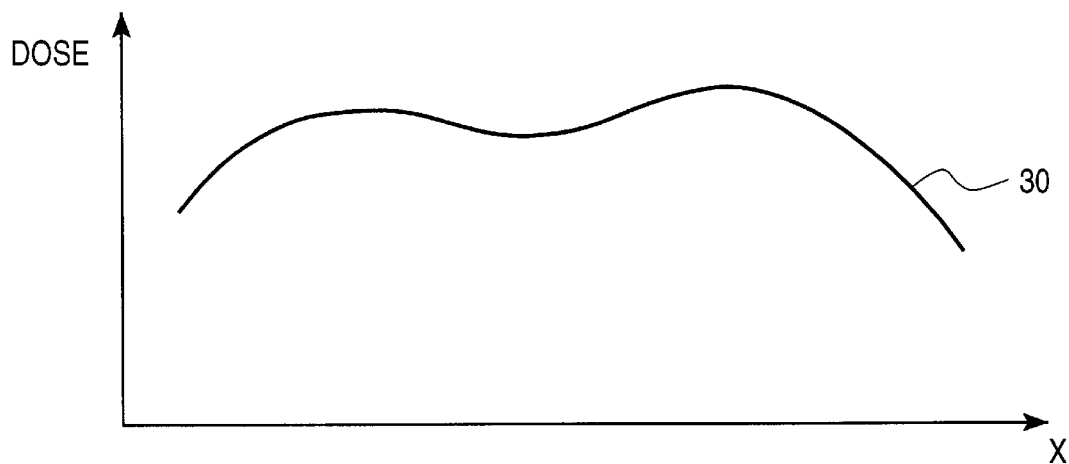
FIG. 4A is an example of a dose profile over the scanned field length in the scanning direction, in which the dose level varies due to combination of diffracted, and scattered light and other undesirable effects, such as illumination non-uniformity at the mask plane that exist in the tool as well.
Figure 4B:
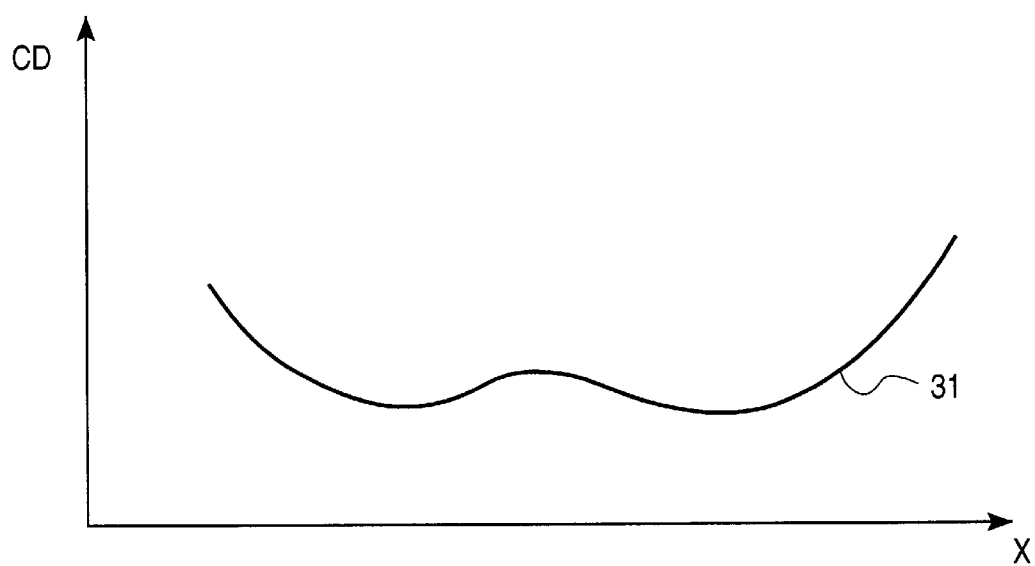
FIG. 4B is a graph showing a critical dimension distribution across the imaging field of a photosensitive medium, when the dose profile of FIG. 4A is experienced in patterning a latent image in the photosensitive medium.

Referring to FIGS. 4A–B, they show a relationship of the dose and the critical dimension (or CD) as they pertain to the photosensitive medium in the scanning direction. The dose in FIG. 4A corresponds to the exposure dose received across an imaging field in the scan direction. The CD value shown in FIG. 4B corresponds to positive resists feature's linewidth distribution corresponding to illumination dose distribution depicted on FIG. 4A. The CD curve is qualitatively the inverse of the dose curve, since a positive photoresist linewidth is dependent on the exposure dose, as described above. The CD value will fluctuate across the wafer, partly due to the scattering effect described above. Furthermore, other characteristics of the tool, such as lens aberrations, contribute to the variation of patterned feature linewidth.

Graph 30 of FIG. 4A illustrates an example profile curve of the exposure dose along the scanned given direction for a given mask on a given microlithography tool. The graph 30 illustrates that the dose is not uniform across the mask, due to a variety of imperfections including scattering. Accordingly, the differences in the CD profile across the field is shown in a graph 31 of FIG. 4B. The fact that variations in the CD profile can exist is known in the art.

Accordingly, the CD profile graph 31 in FIG. 4B illustrates the critical dimension variation along the scanned length. The variations in the amplitude of the graph 31 illustrate a profile of the CD across the imaging field. The non-uniform CD profile corresponds to the non-uniform linewidth distribution across the field when circuit components and interconnects are fabricated. Thus, it is desirable to minimize feature linewidth nonuniformity across the exposure field to the degree possible.

Figure 5:
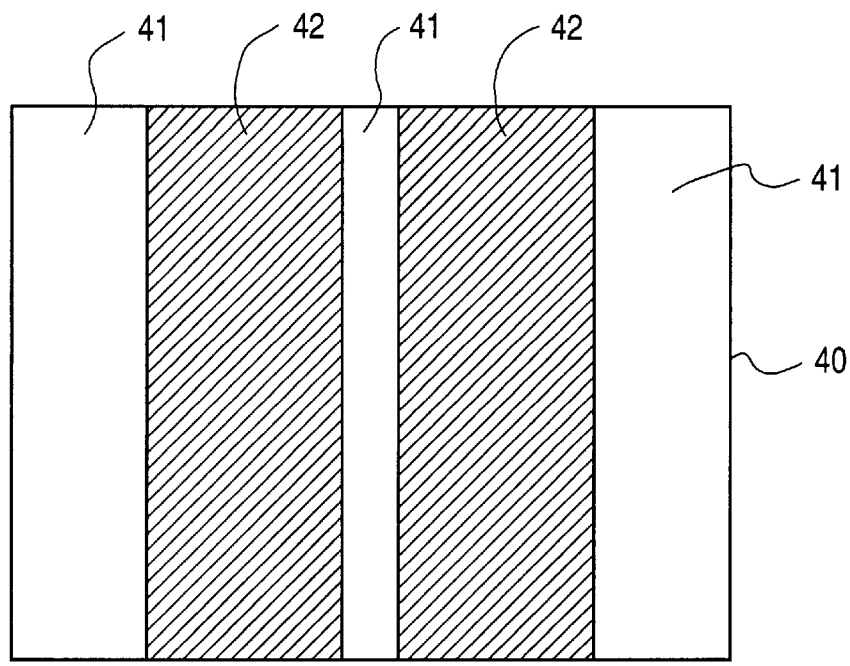
FIG. 5 shows an optical compensator of the present invention to reduce the intensity of light at higher dose regions of FIG. 4A, in order to provide a more uniform dose profile across the imaging field.

The present invention is utilized to correct for this non-uniformity in the CD distribution shown in FIG. 4B, so that a more uniform (ideally flat) CD distribution is obtained. As shown in FIG. 5, an optical compensator 40 is utilized to compensate for the dose/CD variations shown in FIGS. 4A–B. A variety of techniques, of which the preferred techniques are described below, are available to introduce light absorbing areas to achieve desired exposure dose distribution at the wafer plane. As shown in FIG. 5, the optical compensator 40 is transparent (shown by transparent or clear regions 41), except for light absorbing regions 42 dispersed at certain locations throughout. The light absorbing (or "dark") regions 42 are placed to reduce the light exposure at the higher dose areas of the target.

Figure 6:
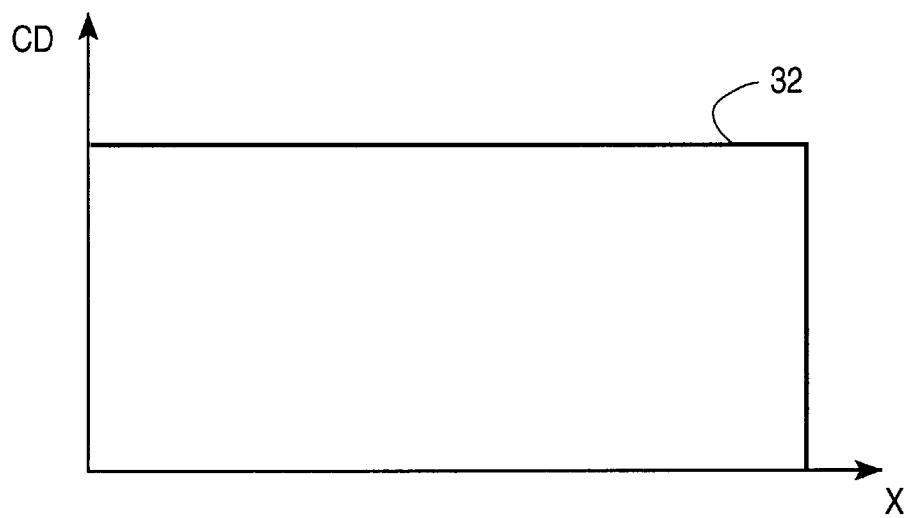
FIG. 6 shows a more uniform critical dimension profile, when the optical compensator of FIG. 5 is used to compensate the variations in the critical dimension profile of FIG. 4B.

Thus, in reference to FIG. 4A, the compensating regions 42 of FIG. 5 coincide to reduce the intensity of light at the higher dose areas of graph 30 of FIG. 4A, so that less light reaches the target at these pattern locations. However, since the low dose regions are unchanged the light reaching these areas of the patterned locations are unchanged. The height differential between the peak and trough in the graph 30 is reduced, so that a much more flat dose profile distribution at the wafer plane is obtained. FIG. 6 shows the resulting CD profile when a compensator of FIG. 5 is used to reduce the light intensity at the higher exposure dose regions to achieve a more uniform dose across the horizontal profile. A more uniform (flat) dose profile 32 results in a more uniform CD profile.

It is appreciated that the desired total dose level can be controlled by controlling the exposure time. Since the imaging field receives a more uniform dose across the imaging field, the exposure dose level received by the target is maintained uniform. Accordingly, a more uniform exposure across the field allows for an improved dimension control across the imaging field.

A number of techniques are available to implement the optical compensation technique of providing a more uniform dose profile. Two preferred techniques are described in reference to FIGS. 7 and 8. In the Figures, the mask 10, photosensitive medium 18 on the wafer 11 and light source 12 have retained the same numbers to identify the same features as shown in FIGS. 1 and 2. An optical (lens) element or system 13 is used in these Figures to show that either the stepper optical element 13a of FIG. 1 or the scanner optical element 13b of FIG. 2 can be used. That is, the present invention can be adapted for current and future generations of steppers or scanners.

Figure 7:
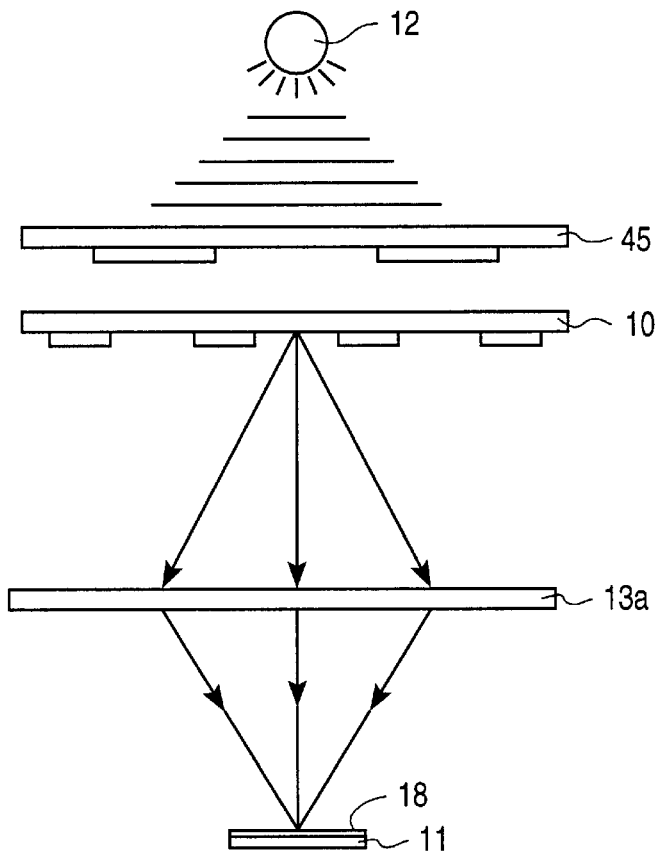
FIG. 7 shows one embodiment of the present invention in which a filter element is used to provide the optical compensation of the present invention.

In FIG. 7, the optical compensator 40 of FIG. 5 is implemented as a compensating filter 45. The filter can be fabricated using any available technique employed in the prior art to form gradient neutral density filters. For example, the base material can be quartz, while the light absorbing elements can be made of chrome. The transparency profile of this filter is described in the example shown in FIG. 5. Generally, it is preferable to insert the filter 45 between the light source 12 and the mask 10 so that only illumination intensity at the mask plane is affected. The filtering action of the filter 45 reduces light intensity at those regions which would normally result in higher exposure dose at the target. In a scanner system, the filter 45 would move synchronously with the mask 10 to achieve desired effect.

Figure 8:
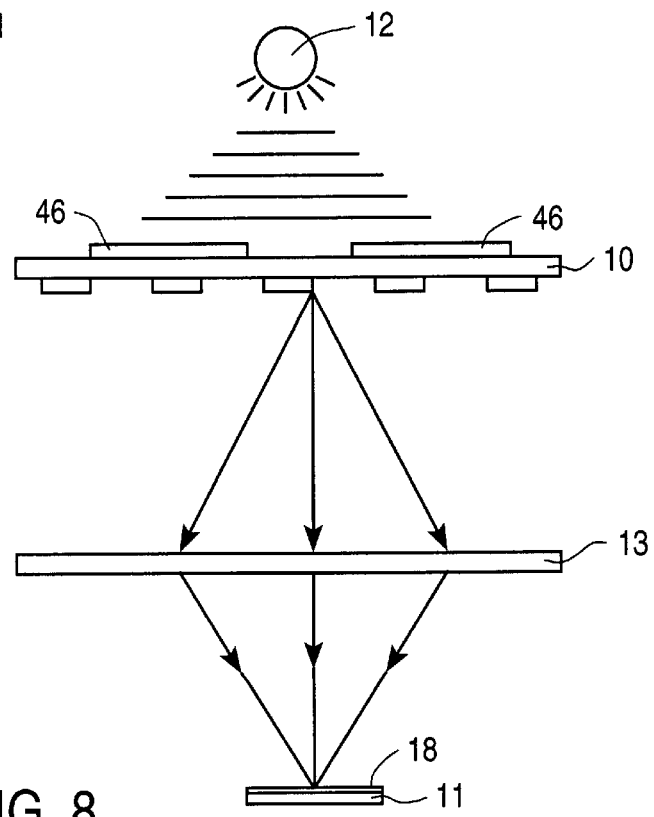
FIG. 8 shows another embodiment of the present invention in which the optical compensation of the present invention is implemented on the back of the image patterning mask.

In FIG. 8, the optical compensator 40 is implemented as part of the mask 10. Gradient neutral density filter features 46 are fabricated on the backside of the mask 10. The features 46 perform the same compensating function as the filter 45, but is now part of the mask. Since the features are not located on the front face of the mask, they are not within the focal plane so as not to be imaged onto the target.

There is a significant distinction in the application aspect of the invention between the filter 45 of FIG. 7 and the mask having features 46. With the arrangement in FIG. 8, the features 46 are placed on the mask 10, when the mask is manufactured. Thus, it is mask specific to each individual mask. With the filter 45 arrangement, the filter element can be fabricated after the mask is manufactured. Also, it is not mask specific (although pattern specific), so that the same filter can be used with other masks having the same or similar patterns.

Figure 9A:
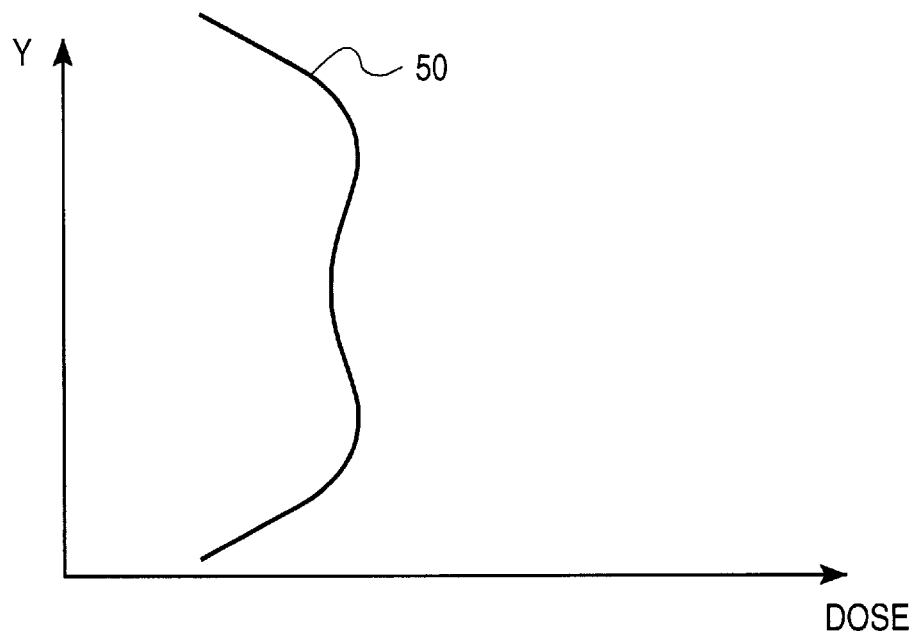
FIG. 9A is an example of a dose profile similar to FIG. 4A, but now obtained over a direction perpendicular to the scanning direction, in which the dose level varies due to scattering and other undesirable effects introduced in the tool.
Figure 9B:
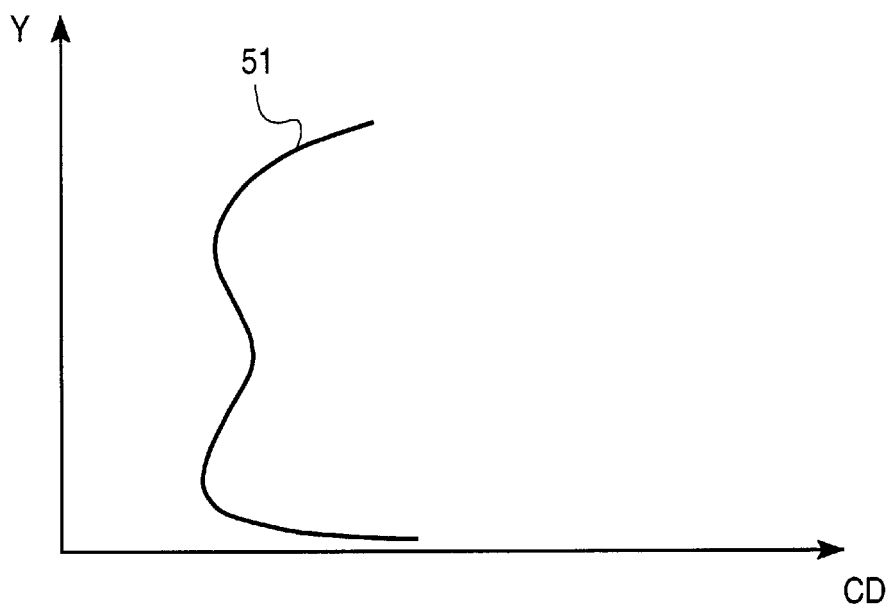
FIG. 9B is a graph showing a critical dimension profile across the imaging field of a photosensitive medium, when the dose profile of FIG. 9A is experienced in patterning a latent image in the photosensitive medium.
Figure 9C:
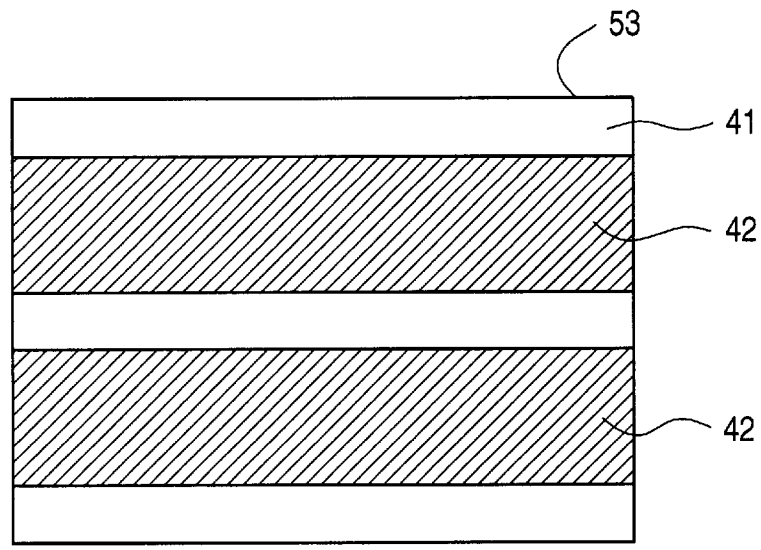
FIG. 9C shows an optical compensator of the present invention to reduce the intensity of light at higher dose regions of FIG. 9A, in order to provide a more uniform dose profile across the imaging field in the perpendicular direction from the horizontal.

It is appreciated that the optical compensating techniques described above can be configured to compensate the CD profile in any direction of the exposed field. FIGS. 9A–D, illustrate the compensation technique in direction orthogonal to the scanning direction (cross scan direction). FIG. 9A shows a dose profile 50 in the cross scan direction (noted as Y in the Figures), while FIG. 9B shows the corresponding CD profile 51. For example, the CD profile 51 can be along the length of the aperture slot of the scanner. Then, one of the compensating techniques described above is then implemented to provide an optical compensator 53 in the cross scan direction. As shown in FIG. 9C, the optical compensator 53 is equivalent to the compensator 40 of FIG. 5.

Figure 9D:
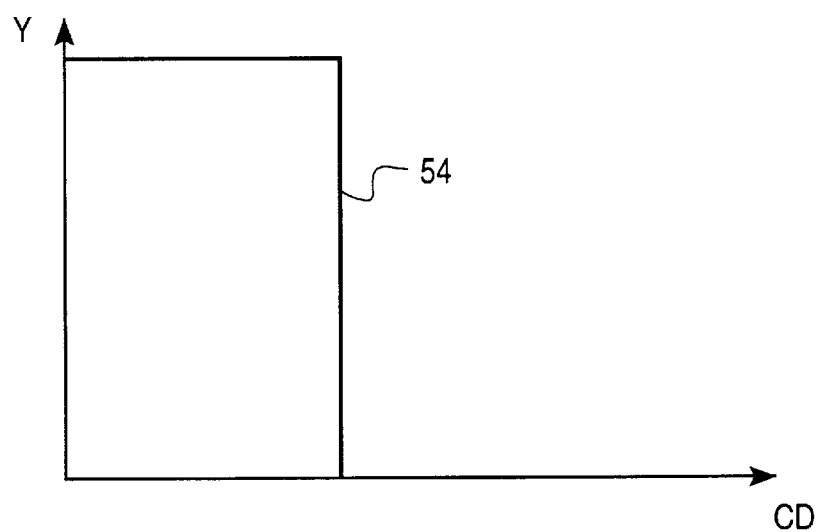
FIG. 9D shows a more uniform critical dimension profile, when the optical compensator of FIG. 9C is used to compensate the variations in the critical dimension profile of FIG. 9B.

Accordingly, with the particular dose profile of FIG. 9A, the optical compensator 51 has a light absorbing pattern as shown in FIG. 9B to compensate for the higher exposure regions. Then, with proper optical compensation, a uniform CD profile 54 is obtained, as shown in FIG. 9D.

It is appreciated that a more sophisticated compensating scheme can be implemented in which compensation is obtained for both directions. By combining the two profiles, a two-dimensional planar CD profile can be obtained. Consequently, compensation techniques can be applied in two dimensions by adapting one or more of the techniques described above, so that both scan and cross scan directions are compensated to provide a more uniform dose distribution across the complete imaging field to improve the overall CD for the pattern.

Furthermore, it is to be noted that the compensator of the present invention can be configured to have varying light absorbing qualities. That is, the optical compensator can implement a gradient for absorbing light. Accordingly, the degree of light absorbed can be adjusted to correspond to the dose profile described above. Again, this can be implemented in the two-dimensional planar field as well.

Thus, a technique for providing across field dimensional control to improve linewidth variations on an integrated circuit is described.

We claim:

1. An apparatus for compensating light exposure on a photosensitive medium across an imaging field to improve uniformity of critical dimensions of features patterned from a latent image formed in the photosensitive medium comprising:

a transparent filter inserted between a light source and the photosensitive medium so that light traverses through said transparent filter to expose the photosensitive medium;

a light absorbing element disposed on said transparent filter and corresponding to locations where light exposure on the photosensitive medium is at a higher dose, said light absorbing element reducing light exposure at the locations of higher dose to compensate for non-uniform exposure dose of the photosensitive medium.

2. The apparatus of claim 1 wherein the non-uniform exposure dose is caused by light scattering.

3. The apparatus of claim 2 wherein the non-uniform exposure dose is also caused by aberrations in a tool used for patterning the latent image.

4. The apparatus of claim 1 is inserted between the light source and a mask used to pattern the latent image in the photosensitive medium.

5. An apparatus for compensating light exposure on a photosensitive medium across an imaging field to improve uniformity of critical dimensions of features patterned from a latent image formed in the photosensitive medium comprising:

a mask inserted between a light source and the photosensitive medium so that light traverses through said mask to expose the photosensitive medium to form the latent image corresponding to a pattern defined by the mask;

a light absorbing element disposed on said mask and corresponding to locations where light exposure on the photosensitive medium is at a higher dose, said light absorbing element reducing light exposure at the locations of higher dose to compensate for non-uniform exposure dose of the photosensitive medium.

6. The apparatus of claim 5 wherein the non-uniform exposure dose is caused by light scattering.

7. The apparatus of claim 6 wherein the non-uniform exposure dose is also caused by aberrations in a tool used for patterning the latent image.

8. The apparatus of claim 5 wherein said light absorbing element is disposed on an opposite surface from mask features which define a pattern for forming the latent image in the photosensitive medium.

9. In a microlithography tool which is used to pattern integrated circuit devices on a semiconductor wafer, an apparatus for compensating light exposure on a photosensitive medium across an imaging field to improve uniformity of critical dimensions of features patterned from a latent image formed in the photosensitive medium comprising:

a transparent filter inserted between a light source and the photosensitive medium so that light traverses through said transparent filter to expose the photosensitive medium;

a light absorbing element disposed on said transparent filter and corresponding to locations where light exposure on the photosensitive medium is at a higher dose, said light absorbing element reducing light exposure at the locations of higher dose to compensate for non-uniform exposure dose of the photosensitive medium.

10. The apparatus of claim 9 wherein the non-uniform exposure dose is caused by light scattering.

11. The apparatus of claim 10 wherein the non-uniform exposure dose is also caused by aberrations in a tool used for patterning the latent image.

12. The apparatus of claim 9 is inserted between the light source and a mask used to pattern the latent image in the photosensitive medium.

13. The apparatus of claim 9 wherein the microlithography tool is a stepper.

14. The apparatus of claim 9 wherein the microlithography tool is a scanner.

15. In a microlithography tool which is used to pattern integrated circuit devices on a semiconductor wafer, an apparatus for compensating light exposure on a photosensitive medium across an imaging field to improve uniformity of critical dimensions of features patterned from a latent image formed in the photosensitive medium comprising:

a mask inserted between a light source and the photosensitive medium so that light traverses through said mask to expose the photosensitive medium to form the latent image corresponding to a pattern defined by the mask;

a light absorbing element disposed on said mask and corresponding to locations where light exposure on the photosensitive medium is at a higher dose, said light absorbing element reducing light exposure at the locations of higher dose to compensate for non-uniform exposure dose of the photosensitive medium.

16. The apparatus of claim 15 wherein the non-uniform exposure dose is caused by light scattering.

17. The apparatus of claim 16 wherein the non-uniform exposure dose is also caused by aberrations in a tool used for patterning the latent image.

18. The apparatus of claim 15 wherein said light absorbing element is disposed on an opposite surface from mask features which define a pattern for forming the latent image in the photosensitive medium.

19. The apparatus of claim 15 wherein the microlithography tool is a stepper.

20. The apparatus of claim 15 wherein the microlithography tool is a scanner.

21. A method of compensating light exposure on a photosensitive medium across an imaging field to improve uniformity of critical dimensions of features patterned from a latent image formed in the photosensitive medium, comprising the steps of:

inserting a light absorbing compensator between a light source and the photosensitive medium so that light traverses there through to expose the photosensitive medium, the compensator having a light absorbing element disposed thereon and corresponding to locations where light exposure on the photosensitive medium is at a higher dose;

exposing the photosensitive medium to light which passes through the compensator and in which the light absorbing element reduces light exposure at the locations of higher dose to compensate for non-uniform exposure dose of the photosensitive medium.

22. The method of claim 21 wherein the inserting step further includes the step of placing the compensator between the light source and a mask used to pattern the latent image in the photosensitive medium.

23. The method of claim 21 wherein the inserting step further includes the step of placing the compensator on an opposite surface from mask features which define a pattern for forming the latent image in the photosensitive medium.

* * * * *